(12) United States Patent
Janzen et al.

(10) Patent No.: US 6,445,624 B1
(45) Date of Patent: Sep. 3, 2002

(54) METHOD OF SYNCHRONIZING READ TIMING IN A HIGH SPEED MEMORY SYSTEM

(75) Inventors: Jeffery W. Janzen; Troy A. Manning, both of Meridian; Chris G. Martin; Brent Keeth, both of Boise, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/790,538

(22) Filed: Feb. 23, 2001

(51) Int. Cl.$^7$ .................................................. G11C 7/00
(52) U.S. Cl. .................. 365/191; 365/233; 365/189.01
(58) Field of Search ............................... 365/191, 233, 365/189.04, 189.01, 194

(56) References Cited

U.S. PATENT DOCUMENTS

| | | | |
|---|---|---|---|
| 4,519,034 A | 5/1985 | Smith et al. | |
| 5,966,731 A | 10/1999 | Barth et al. | |
| 6,067,260 A | * 5/2000 | Ooishi et al. | ................ 365/200 |
| 6,125,078 A | * 9/2000 | Ooishi et al. | ................ 365/233 |

\* cited by examiner

*Primary Examiner*—David Nelms
*Assistant Examiner*—Thong Le
(74) *Attorney, Agent, or Firm*—Dickstein Shapiro Morin & Oshinsky LLP

(57) ABSTRACT

The read latency of a plurality of memory devices in a high speed synchronous memory subsystem is equalized through the use of at least one flag signal. The flag signal has equivalent signal propagation characteristics read clock signal, thereby automatically compensating for the effect of signal propagation. After detecting the flag signal, a memory device will begin outputting data associated with a previously received read command in a predetermined number of clock cycles. For each of the flag signal, the memory controller, at system initialization, determines the required delay between issuing a read command and issuing the flag signal to equalize the system read latencies. The delay(s) are then applied to read transactions during regular operation of the memory system.

41 Claims, 8 Drawing Sheets

METHOD OF SYNCHRONIZING READ TIMING IN A HIGH SPEED MEMORY SYSTEM

FIELD OF THE INVENTION

The present invention relates generally to high speed synchronous memory systems, and more particularly to controlling the read latency of memory devices so that read data from any memory device arrives at the memory controller at the same time.

BACKGROUND OF THE INVENTION

An exemplary computer system is illustrated in FIG. 1. The computer system includes a processor 500, a memory subsystem 100p, and an expansion bus controller 510. The memory subsystem 100p and the expansion bus controller 510 are coupled to the processor 500 via a local bus 520. The expansion bus controller 510 is also coupled to at least one expansion bus 530, to which various peripheral devices 540–542 such as mass storage devices, keyboard, mouse, graphic adapters, and multimedia adapters may be attached.

The memory subsystem 100p includes a memory controller 400p and a plurality of memory modules 301p–302p which each include a plurality of memory devices, for example, DRAM-1 101p and DRAM-2 102p for memory module 301p and DRAM-3 103p and DRAM-4 104p for memory module 302p. Each memory device 101p–104p is a high speed synchronous memory device. Although only two memory modules 301p, 302p and associated signal lines 401ap, 401bp, 402ap, 402bp, 403p, 406p, 407p are shown in FIG. 1, it should be noted that any number of memory modules can be used. Similarly, although each memory module is illustrated as having only two memory devices 101p–102p, 103p–104p, the memory modules 301p–302p may have more or less memory devices 101p–104p, though a typical configuration may have eight or nine memory devices on each memory module. Signal lines 401ap, 401bp, 402ap, 402bp, and 403p, are known as the data bus 150p, while signal tines 406p and 407p are known as the command/address bus 151p.

The data bus 150p includes a plurality of data signal lines 401ap, 401bp which is used to exchange data DATA between the memory controller 400p and the memory devices 101p–104p. Read data is output from the memory modules 301p, 302p and serially synchronized to a free running read clock signal RCLK on the read clock signal line 402ap, 402bp. The read clock signal RCLK is generated by the memory controller 400p and first driven to the farthest memory module 302p from the memory controller 400p before being driven through the remaining memory module(s) 301p to return to the memory controller 400p. Write data is output from the memory controller 400p and serially synchronized to a free running write clock signal WCLK on the write clock signal line 403p. The write clock is generated by the memory controller 400p and driven first to the closest memory module $^{301}p$ before being driven through the remaining memory module(s) 302p. A plurality of command signal lines 406 is used by the memory controller 400p to send commands CMD to the memory modules 301p, 302p. Similarly, a plurality of address signal lines 407p are used by the memory controller to send addresses ADDR to the memory modules 301p, 302p. The data bus 150p or the command/address bus 151p may have additional signal lines which are well known in the art, for example chip select lines, which are not illustrated for simplicity. The commands CMD and addresses ADDR may also be buffered by an register (not shown) on the memory modules 301p, 302p before being distributed to the memory devices 101p–104p of a respective module. Each of the plurality of write clock signal lines 404p, the plurality of data signal lines 401a, 401b, the plurality of command signal lines 406, and the plurality of address signal lines 407 is terminated by a terminator 450, which may be a resistor.

When a memory device 101p–104p accepts a read command, data associated with that read command is not output on the data bus 150p until a certain amount of time has elapsed. This time is known as device read latency. Each memory device 101p–104p has an associated minimum device read latency but can also be operated at a plurality of greater read latencies. The amount of time which elapses between the time the memory controller 400p issues a read command and the time read data arrives at the memory controller 400p is known as system read latency. System read latency is equal to the sum of a memory device's 101p–104p device read latency and the signal propagation time between the memory device 101p–104p and the memory controller 400p. Since memory module 301p is closer to the memory controller 400p than memory module 302p, the memory devices 101p, 102p located on memory module 301p have shorter signal propagation times than the memory devices 103p, 104p located on memory module 302p. At high clock frequencies (e.g., 300 MHz to at least 533 MHz), this difference in signal propagation time may become significant.

Due to differences in each memory device's 101p–104p minimum read latency as well as the differences in signal propagation time of the read clock RCLK along the read clock signal lines 402ap, 402bp (e.g., data output from DRAM-3 103p takes longer to reach the memory controller 400p than data output from DRAM-1 101p because DRAM-3 103 is located farther away from the memory controller 400p than DRAM-1 101p), the memory devices coupled to the same read clock signal line (e.g., DRAM-1 101p and DRAM-3 103p) may have differing system read latencies. Forcing the memory controller 400p to process read transactions with a different system read latency for each memory device 101p–104p would make the memory controller 400p needlessly complex. Accordingly, there is a need for an apparatus and method to equalize the system read latency of the memory devices in order to reduce the complexity of the memory controller.

SUMMARY OF THE INVENTION

The present invention is directed at a method and apparatus for equalizing the system read latency of memory devices in a high speed memory subsystem. The present invention is directed at the use of a plurality of flag signals which controls the device read latency of each memory device. The flag signals are routed so that they have equivalent signal propagation times as the read clock signal. A memory device according to the present invention will begin to output data associated with a previously accepted read command at a predetermined number of read clock cycles after it receives the flag signal. Thus, the timing of the flag signal determines the device read latency of the memory device. A memory controller according to the present invention will perform a calibration routine during initialization. The calibration routine is used to determine the minimum timing offset required between the read command and the flag signal which will permit each memory device coupled to the same read clock signal line to reliably output read data, i.e., meet each device's minimum device read latency. Alternatively, the minimum timing offset may be predetermined and stored on a memory (e.g., a serial presence detect or SPD EEPROM), thereby permitting the controller to set a timing offset without having to perform a calibration. The timing offset is used during normal operation to control when each memory device outputs read data. Since the flag signal has an equivalent signal propagation timing as the read clock path due to a similar path length and signal propagation characteristics, the signal propagation time of the flag signal automatically compensates for the difference in signal propagation times between the memory devices, thereby ensuring that the memory controller sees the same system read latency for each memory device coupled to the flag signal. In an alternate embodiment, the flag signals are local to each memory module and generated by a flag generation logic also located on the memory module. Under this system the flag signals are associated with the memory module and serve to equalize the latency of the memory devices of each memory module.

BRIEF DESCRIPTION OF THE DRAWINGS

The forgoing and other advantages and features of the invention will be more clearly understood from the following detailed description of the invention which is provided in connection with the accompanying drawings.

DETAILED DESCRIPTION OF THE PREFERRED EMBODIMENTS

Figure 2:
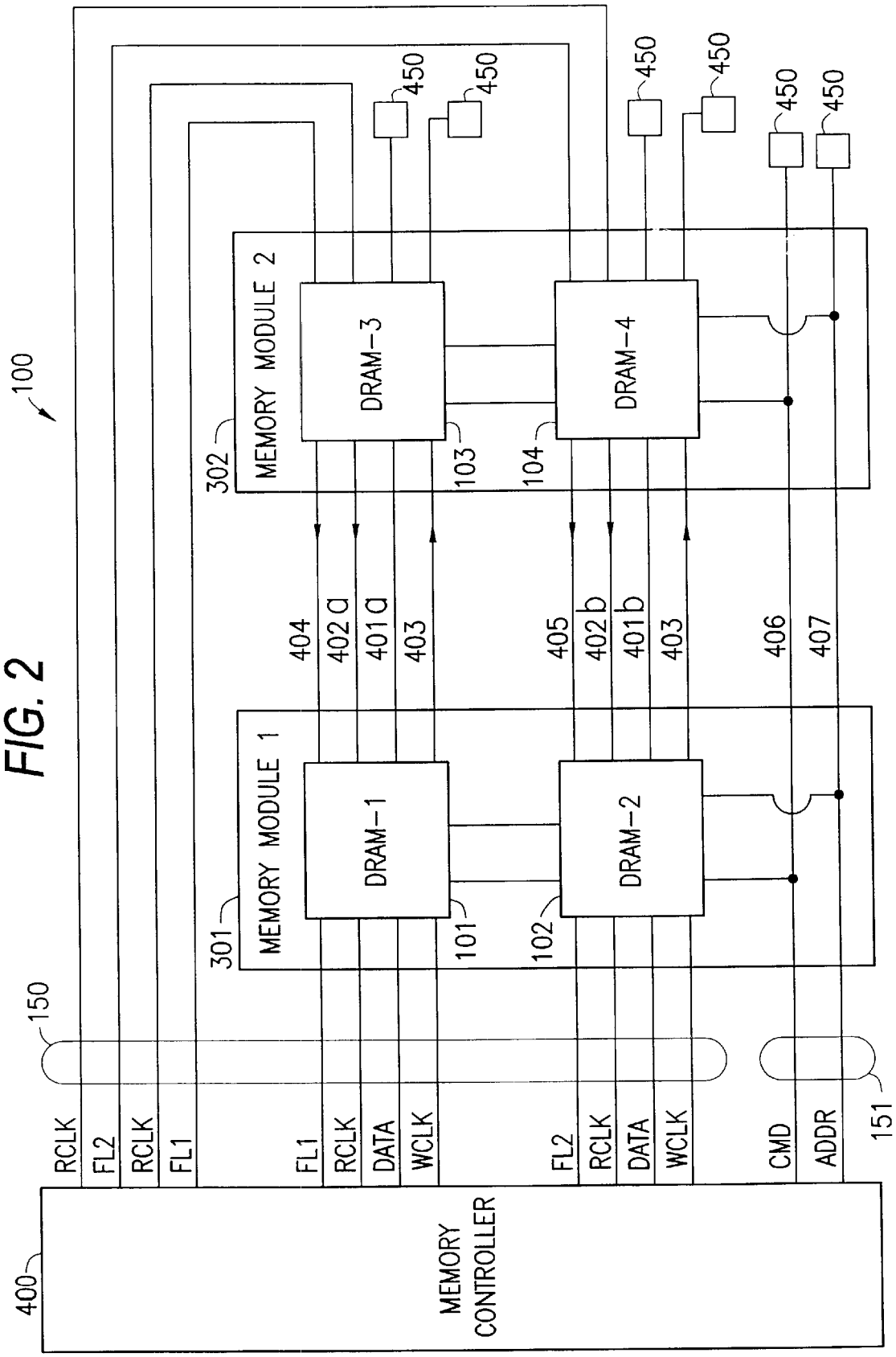
FIG. 2 is a block diagram of a high speed memory system according to a first embodiment of the present invention.

Now referring to the drawings, where like reference numerals designate like elements, there is shown in FIG. 2 an illustration of an exemplary memory subsystem 100 according to the first embodiment of the present invention. The memory subsystem 100 includes a memory controller 400 which transmits a plurality of signals over the data bus 150 and a command/address bus 151. The data bus 150 includes a plurality of flag signals FL1, FL2 which are transmitted using a corresponding plurality of flag signal lines 404, 405. Each flag signal line is associated with a corresponding read clock signal line and the memory devices coupled to that read clock signal line. For example, flag signal FL1 is transmitted on flag signal line 404 and is associated with the read clock RCLK transmitted on read clock signal line 402ap and memory devices DRAM-1 101p and DRAM-3 103p. Each memory module 301, 302 is coupled to the memory controller 400 through the data bus 150, including the plurality of flag signal lines 404, 405. It should be noted that although FIG. 2 (as well as FIGS. 5–8 which are directed to alternate embodiments) illustrates a specific routing scheme for the command signal lines 406 and address signal lines 407, the principles of the present invention are also applicable to alternate routing arrangements. For example, the command signal lines 406 and address signal lines 407 may be routed in parallel to each of the memory devices 101–104, and/or be buffered by a register (not shown).

Figure 3:
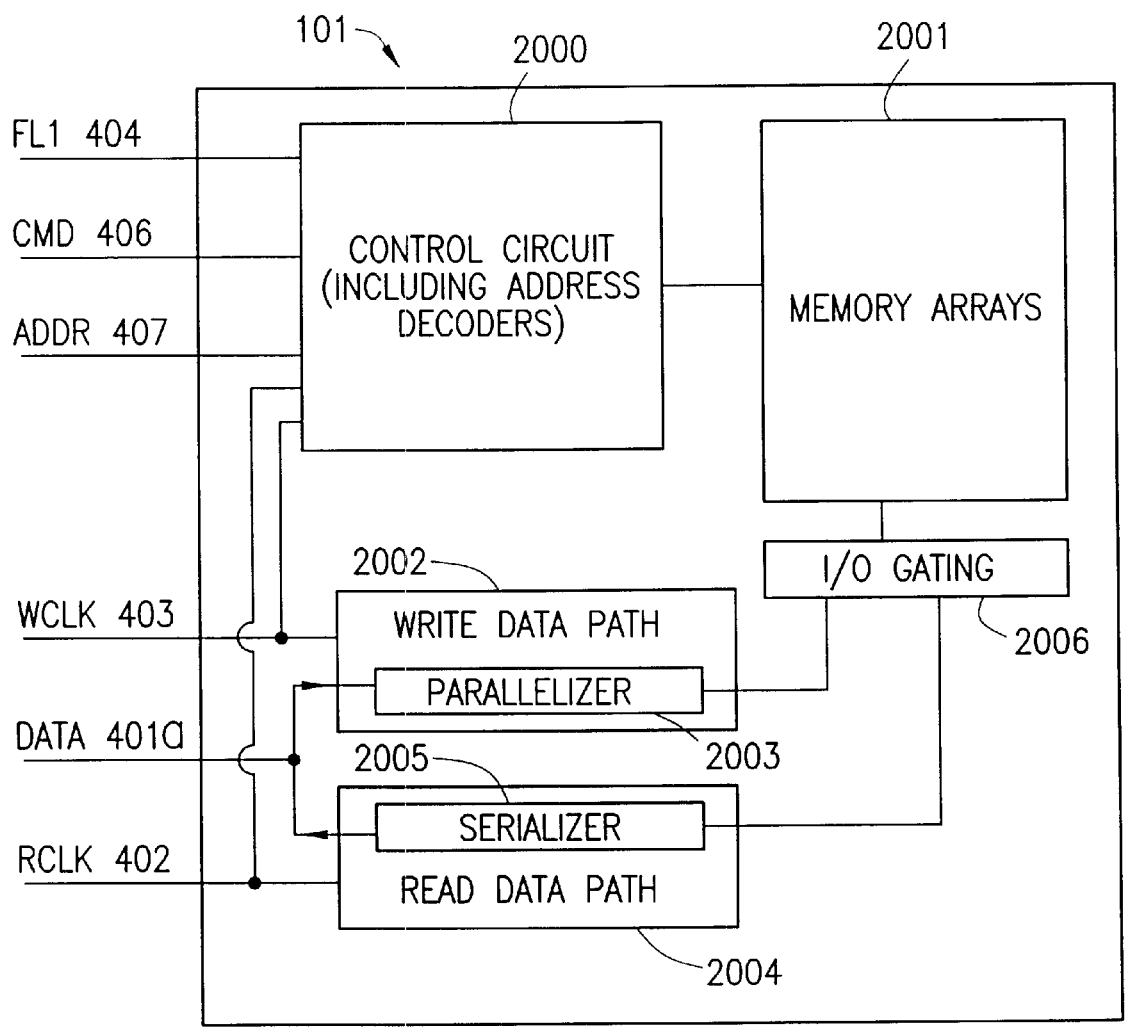
FIG. 3 is a block diagram illustrating a memory device of the high speed memory system shown in FIG 2.
Figure 4:
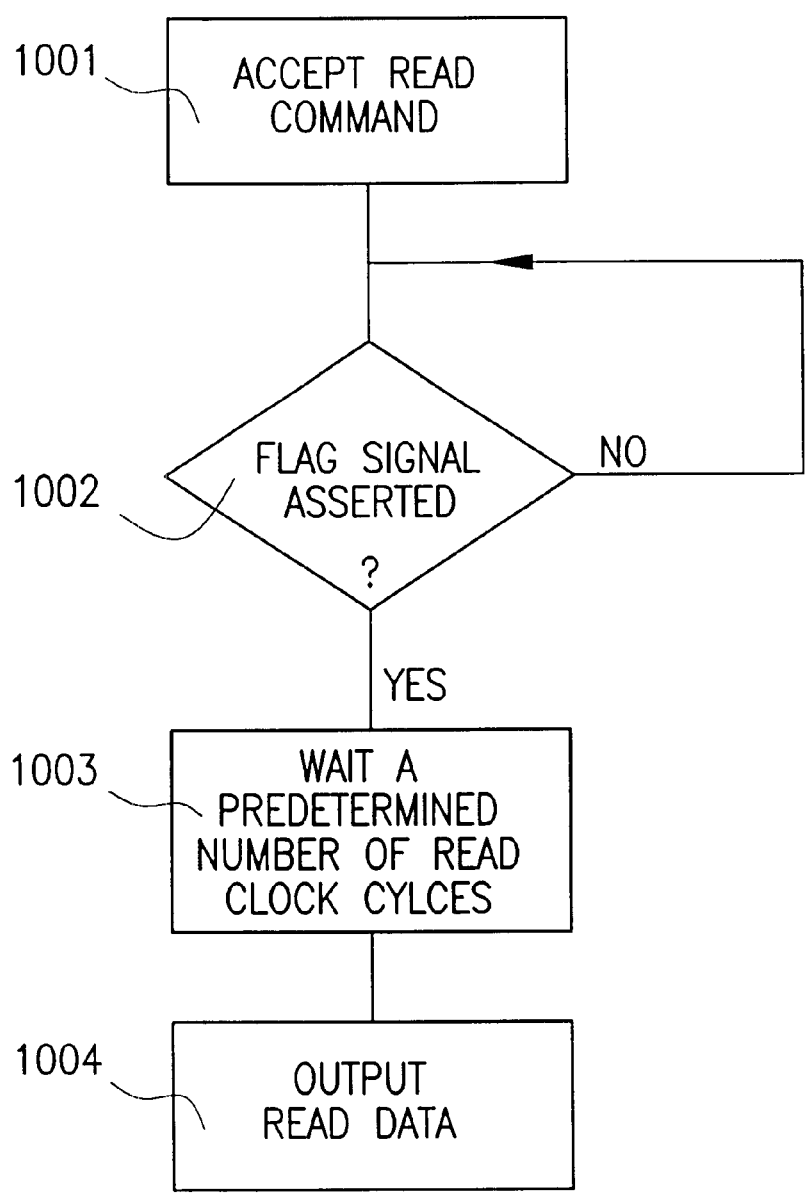
FIG. 4 is a flow chart illustrating how a memory device responds to a flag signal.

FIG. 3 is a more detailed diagram of one of the memory modules 101 shown in FIG. 2. In the exemplary embodiment, the memory devices 101–104 are Advance DRAM Technology (ADT) devices. However, the principles of the present invention may be incorporated into any type of synchronous memory device. An ADT memory device 101 includes a control circuit 2000 (including address decoders) coupled to the read clock signal Line 402a, the write clock signal line 403, the flag signal line 404, the plurality of command signal lines 406, and the plurality of address signal lines 407. The control circuit 2000 may be coupled to additional conventional signal lines which are not illustrated in order to simplify the figure. The ADT memory device 101 also includes a write data path 2002 and a read data path 2004, both of which are coupled to the data signal line 401a and a plurality of memory arrays 2001 (via I/O Gating circuit 2006.) The read data path 2004, which is also coupled to the read clock signal line 402a, includes a serializer 2005, which converts the parallel data read from the plurality of memory arrays 2001 into the serial data output on the data signal line 401a in synchronism with the read clock signal RCLK. Similarly, the write data path 2002, which is also coupled to the write clock signal line 403, includes a parallelizer 2003 which converts serial write data from the data signal line 401a into parallel data.

The memory device 101 uses the flag signal FL1 as a cue to determine when to begin the output of data associated with a previously accepted read command. The memory device thereby has its read latency determined by the timing of the flag signal FL1 on the flag signal line 404. More specifically, the memory device's 101 control circuit 2000 causes the read data path 2003 to begin outputting data associated with a previously accepted read command at a predetermined number of read clock cycles after the flag FL1 has been asserted on the flag signal line 404.

The process is illustrated in FIG. 3, which begins at step 1001 when the memory device accepts a read command transmitted over the plurality of command signal lines 406. In step 1002, the control circuit waits until the flag signal FL1 has been received. After the flag signal is received, in steps 1003–1004 the memory device waits a predetermined number of read cock cycles before outputting data. In the exemplary embodiment, the memory device 101 will begin to output read data four read clock cycles after receiving the flag signal FL1. However, a different number of elapsed read clock cycles may be used, as long as the number is the same for each memory device 101–104 and includes sufficient time for the memory device 101–104 to output the requested data.

The control timing for a memory device's 101–104 device read latency set via the flag signals FL1, FL2 is determined in a calibration procedure performed by the memory controller at, for example, system initialization. At such time, the memory controller 400 determines a timing offset between when it issues a read command and when it issues a flag signal for each memory device. The timing offset will equalize the system read latencies of the memory devices (e.g., DRAM-1 101 and DRAM-3 103) coupled to the same flag signal line (e.g. flag signal line 404). The calibration process is performed on a flag signal line basis.

The calibration process begins when the memory controller 400 sends a calibrate command to the memory device (e.g., DRAM-3 103) located farthest from the memory controller 400 of the memory devices coupled to the flag signal line being calibrated (e.g., flag signal line 404). The calibrate command is a special read command which causes the memory device 103 to output a reference calibration pattern. The reference calibration pattern is formatted to permit the memory controller to easily identify when data first arrives at the memory controller. In the exemplary embodiment memory device 103 returns 8-bits of data per read command. The memory device 103 drives the data serially across the data signal lines 401a to the memory controller 400. A good calibration pattern would permit the memory controller to easily recognize when the first bit of data arrives at the memory controller. In the exemplary embodiment, the preferred reference calibration pattern is a byte in which in the first bit which arrives at the memory controller is set to one state and the remaining bits are set to a different state. Thus (binary) 01111111 or (binary) 10000000 would be good calibration patterns. The choice between these two pattern may be influenced by the bus architecture. For example, in the exemplary embodiment the memory bus 150 is a "pull-up" bus which has a natural logic state of "1". Thus, the pattern (binary) 01111111 would be ideal since the only time a "0" would appear on the bus is if it were being driven onto the bus. However, if the data bus 150 were constructed so that its natural logic state were a "0", the preferred pattern would instead be (binary) 10000000.

As the memory controller 400 issues the calibrate command, it also simultaneously asserts the flag signal FL1 on the flag signal line 404. When DRAM-3 103 receives the flag signal, it begins to output the calibration pattern after the predetermined number of read clock cycles elapses.

The flag signal line 404 is routed so that a the flag signal FL1 will return to the memory controller 400 after it has traversed each of the memory devices 103, 101 coupled to the flag signal line 404 associated with the flag signal FL1. When the memory controller 400 receives the returning flag signal FL1 it will attempt to read the calibration pattern off the data signal line 401a after the predetermined number of read clock cycles has elapsed. If the reference calibration pattern is detected, then the predetermined number of read clock cycles imposes a sufficient device read latency for the memory device 103 to operate properly. If the reference calibration pattern has not been detected, the memory controller concludes that the flag signal FL1 was sent too early, resulting in an attempt to operate the memory device 103 at a device read latency faster than its minimum device read latency. In this case, the memory controller 400 therefore repeats the above described procedure with increasing number of read clock cycles between the sending of the calibrate command and the sending of the flag signal FL1 until the reference calibration pattern is properly received.

The memory controller 400 then repeats the above procedure on each of the remaining memory devices coupled to the same flag signal line. The memory controller continues the process with the next closer memory device coupled to the flag signal line 404 (e.g., DRAM-1 101) until the calibration procedure has been performed on the closest memory device coupled to that same flag signal line (e.g., flag signal line 404). For each iteration, the memory controller 400 adopts the final timing offset used in the previous iteration as the initial timing difference. After the closest memory device (e.g., DRAM-1 101) has been calibrated by this procedure, the final timing offset is adopted by the memory controller 400 for conducting read transactions upon the memory devices coupled to that flag signal lie (e.g., flag signal line 404). This timing offset causes each memory device coupled to the same flag signal line (e.g., flag signal line 404 and memory devices DRAM-1 101, DRAM-3 103) to be operated at the minimum device read latency of the slowest memory device of that set of memory devices. Since the flag signal propagates with equivalent signal propagation characteristics as the read clock path due to a similar path length and signal propagation characteristics, the signal propagation delay of the flag signal automatically compensates for the difference in signal propagation times among the memory devices (e.g., DRAM-1 101 and DRAM-3 103) coupled to the same flag signal line (e.g., flag signal line 404).

For example, in the system illustrated in FIG. 2, the memory 400 controller would first calibrate DRAM-3 103 because DRAM-1 101 and DRAM-3 103 are both coupled to the same flag signal line (i.e., 404) and DRAM-3 103 is the farthest memory device from the memory controller 400. During the first step, the memory controller would simultaneously send the calibrate command and the flag signal FL1. The control circuit 2000 of the memory device 103 causes the memory device to output read data at a predetermined number of read clock cycles following the flag signal. In the exemplary embodiment the predetermined number is 4 read clock cycles. If the calibration pattern is not properly received by the memory controller 400 four cycles after the returning flag signal FL1 is detected at the memory controller 400, this means the memory device 103 was not ready to output read data at the specified time, i.e., the memory device's 103 minimum device read latency had not been satisfied. The memory controller 400 therefore sends another calibrate command but transmits the flag signal FL1 using a modified timing equal to increasing the delay between the read command and the flag signal FL1 by one read clock cycle. The process is repeated until the calibration pattern is detected at the memory controller 400 four clock cycles after the memory controller receives the returning flag signal FL1. This timing is equal to operating the memory device 103 at its minimum device read latency.

The memory controller 400 then proceeds to calibrate the remaining memory devices coupled to the flag signal line 404. The calibration continues with the next closest memory device and is completed when the closest memory device has been calibrated. In this example, the next closest memory device is DRAM-1 101. For each remaining memory device being calibrated, the initial delay between the read command and the flag signal being is set to the final timing offset used for the previously calibrated memory device. In the example, the memory controller 400 continues the calibration process by calibrating DRAM-1 101. The memory controller 400 sends a calibrate command to DRAM-1 101 and waits one read clock cycle before it sends the flag signal FL1 because a one read clock timing difference was the final timing difference used for the previously calibrated memory device (i.e., DRAM-3 103). If the reference calibration pattern is not properly received by the memory controller 400, the memory controller 400 continues to send calibrate commands to DRAM-1 101 using increasing read clock cycle offsets between the read command and the flag signal FL1 for each calibrate command. Suppose the memory controller 400 sent three calibrate commands to DRAM-3 103 before the reference calibration pattern has been properly received at the memory controller.

This corresponds to a timing offset of 3 read clock cycles between the calibrate command and the flag signal (since the first calibrate command adopts the timing from the previous memory module, which is equal to a 1 read clock cycle delay, the second calibrate command increases the timing by 1 read clock cycle to 2 read clock cycles, and finally the third calibrate command increases the timing by yet another read clock cycle to 3 read clock cycles). Since DRAM-1 101 is the closest memory device coupled to the flag signal line 404 the calibration process has been completed for the memory devices coupled to this flag signal line 404. In normal operation the memory controller 400 will assert the flag signal FL1 3 read clock cycles after it sends the read command, and the data returned by each memory device DRAM-1 101, DRAM-3 103 coupled to flag signal line 404 will have the same system latency.

Figure 1:
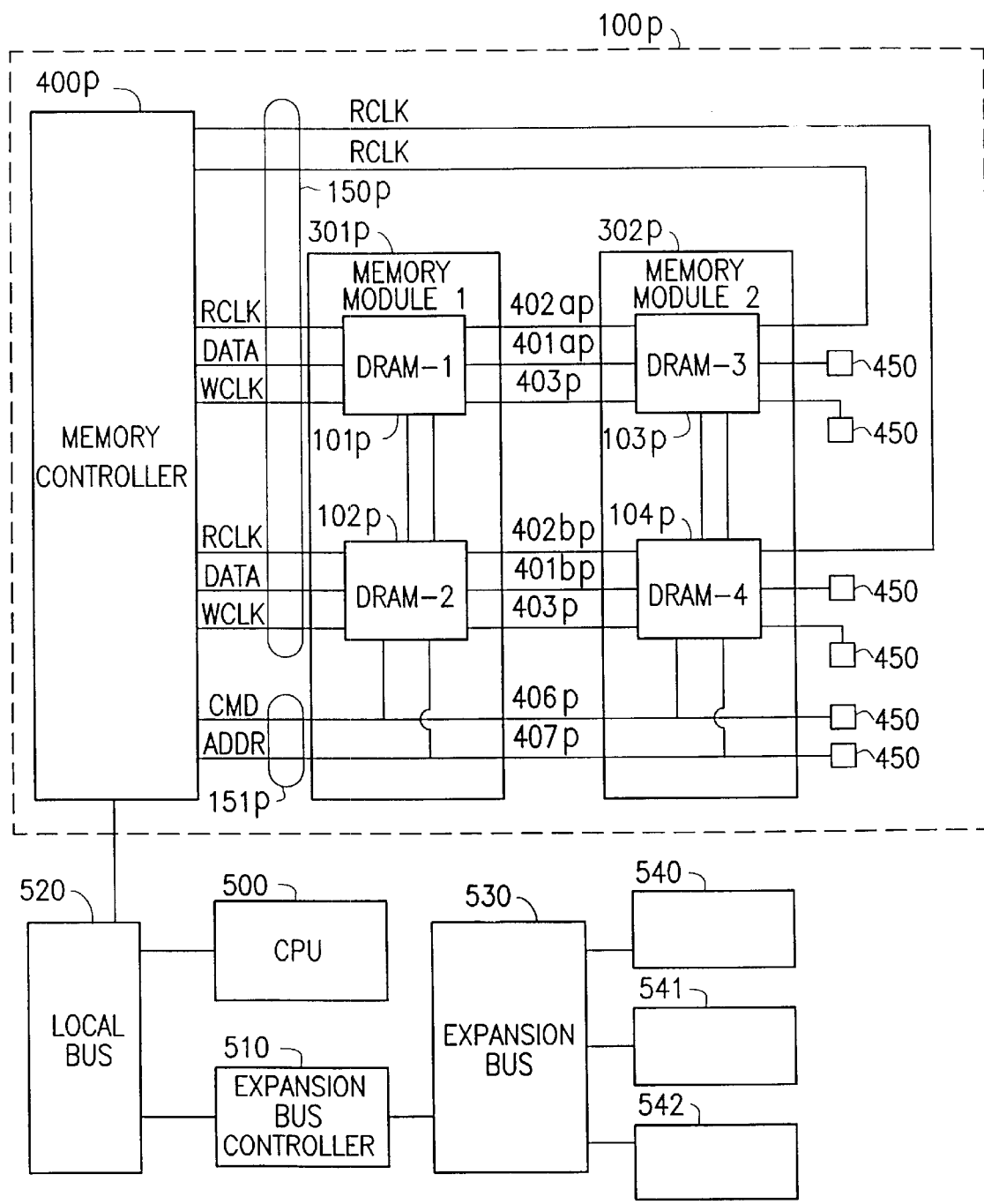
FIG. 1 is a block diagram illustrating a computer system with a high speed memory subsystem.

The above described procedure is performed for each flag signal line (e.g. flag signal line 405). For example, in the system of FIG. 1, flag signal FL2 is used for memory devices DRAM-4 104 and DRAM-2 102. Preferably, the memory controller calibrates each flag line simultaneously. The memory controller may also adopt the maximum of the final timing offsets for the flag lines as a common timing offset for use on every flag line, thereby permitting the memory controller to operate the entire memory system with the same system latency.

One aspect of the invention is that the plurality of flag signals FL1, FL2 have equivalent signal propagation times as the plurality of read clocks RCLK. Since the flag signals FL1, FL2 have the equivalent propagation times as the read clock signal RCLK used to synchronize data output from the memory devices 101–104, the flag signals FL1, FL2 automatically compensate for the difference in signal propagation times between the memory modules 301, 302 of the memory subsystem. In the embodiment illustrated by FIG. 1, the plurality of flag signal lines 404, 405 are routed parallel to the read clock signal lines 402a, 402b to ensure that the plurality of flag signal lines 404, 405 and the read clock signal Lines 402a, 402b have equivalent propagation times.

Figure 5:
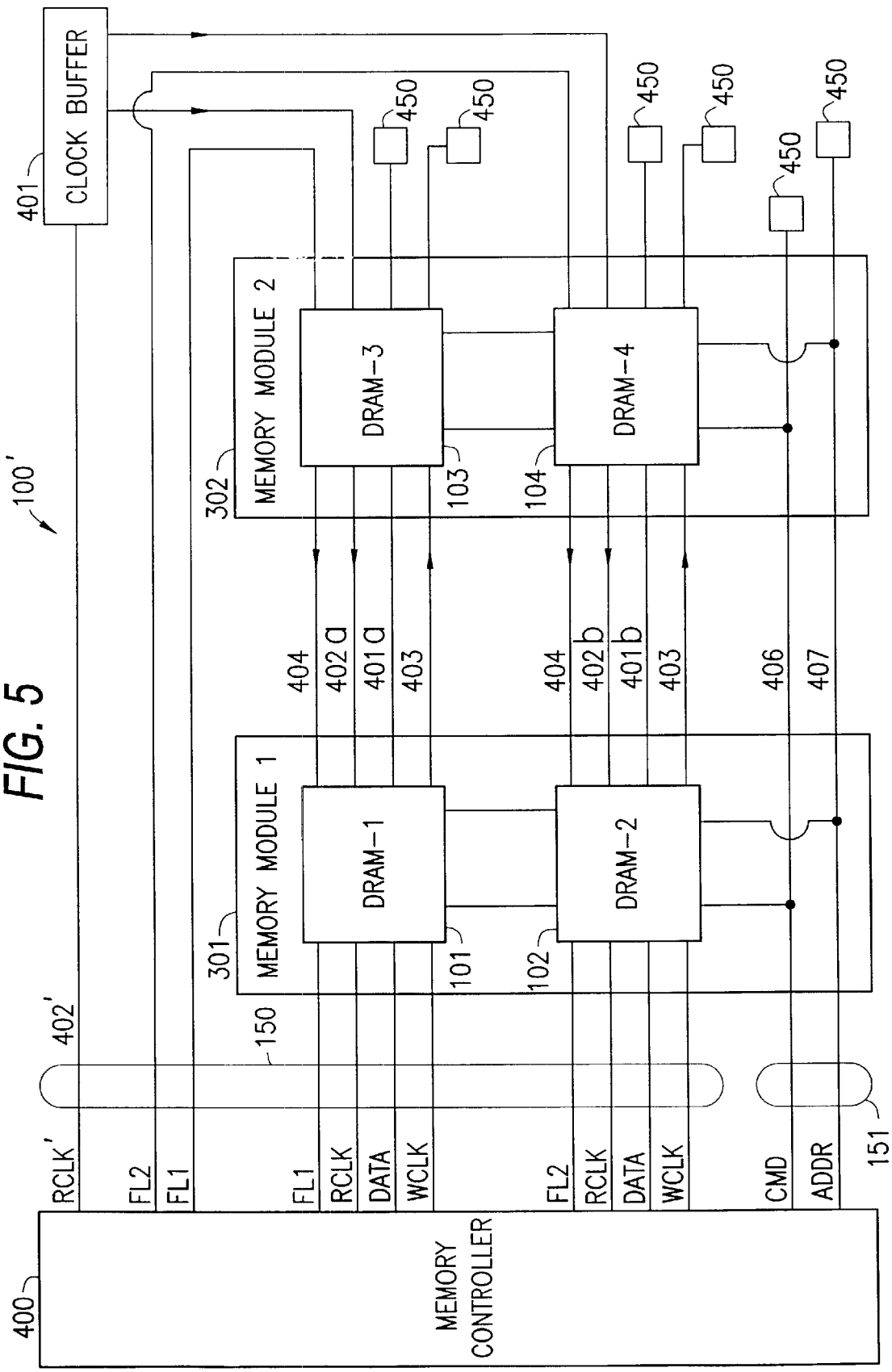
FIG. 5 is a block diagram illustrating a high speed memory system according to a second embodiment of the present invention.

FIG. 5 shows a second embodiment of the memory subsystem 100' of the invention. The memory subsystem 100' routes a single outgoing read clock signal RCLK' on the outgoing read clock signal line 402' from the memory controller 400 to a clock buffer 401. The clock buffer 401 is a low delay device which generates a plurality of read clock signals RCLK on the plurality of read clock signal lines 402a, 402b with virtually identical phasing as the single outgoing read clock signal RCLK'. The plurality of flag signals lines 404, 405 are initially routed parallel to the single outgoing read clock signal line 402' from the memory controller 400 to an area near the clock buffer 401. The plurality of flag signal lines 404, 405 are then routed parallel to the plurality of read clock signal lines 402a, 402b. This arrangement maintains the equivalent propagation times between the flag signals FL1, FL2 and the read clock signals RCLK', RCLK.

Figure 6:
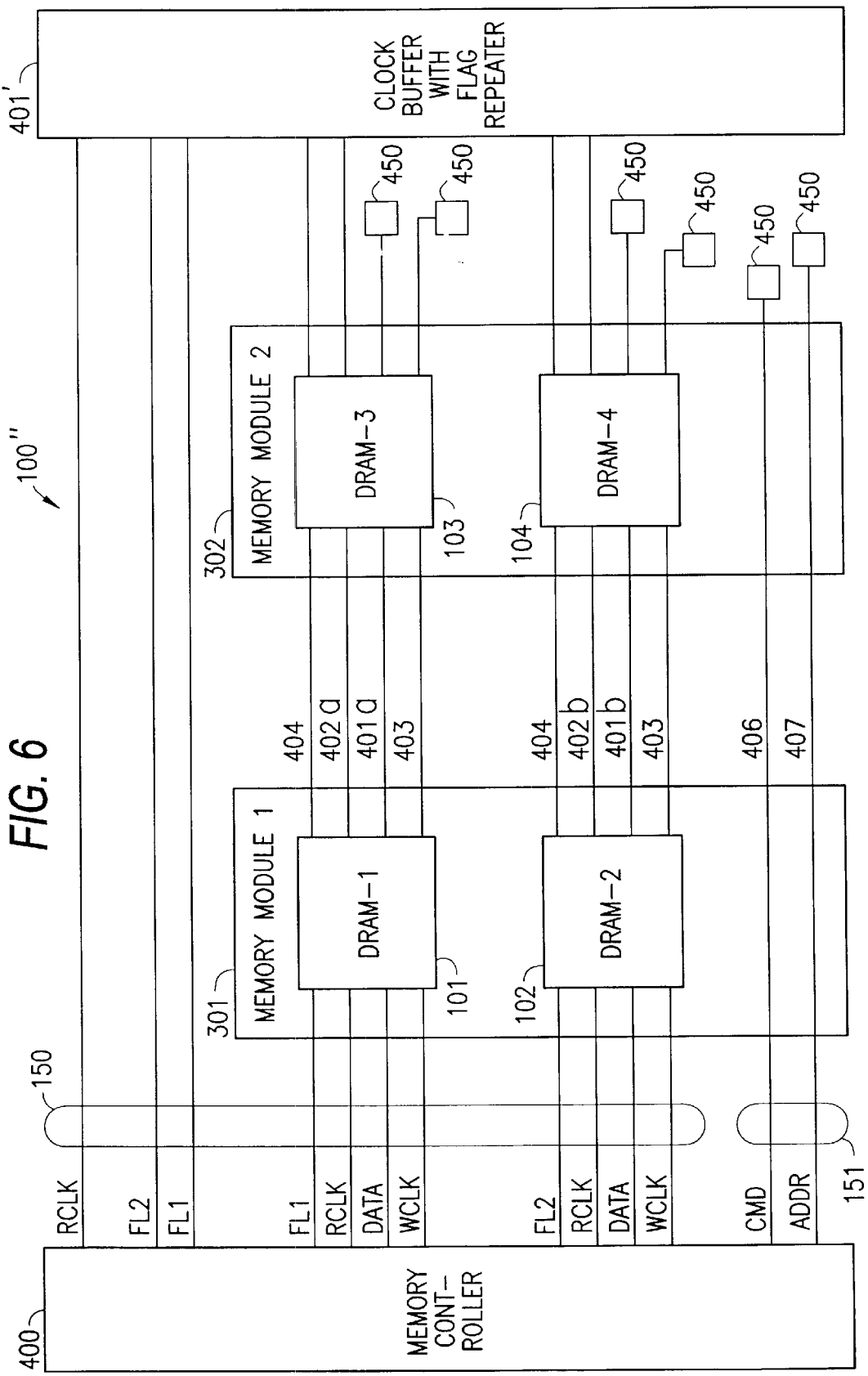
FIG. 6 is a block diagram illustrating a high speed memory system according to a third embodiment of the present invention.

Now referring to FIG. 6, a third embodiment of the invention is illustrated. The memory subsystem 100" of the third embodiment uses a clock buffer with a flag repeater 401'. Thus, the outgoing read clock signal RCLK' as well as the plurality of outgoing flag signals FL1', FL2' are initially routed parallel to each other, from the memory controller 400 to the clock buffer with flag repeater 401'. The clock buffer with flag repeater 401' then retransmits these signals as the plurality of read clock signals RCLK and the plurality of flag signals FL1, FL2. The clock buffer with flag repeater preserves the equivalent signal propagation timing relationship between the read clock signals and the flag signals.

Figure 7:
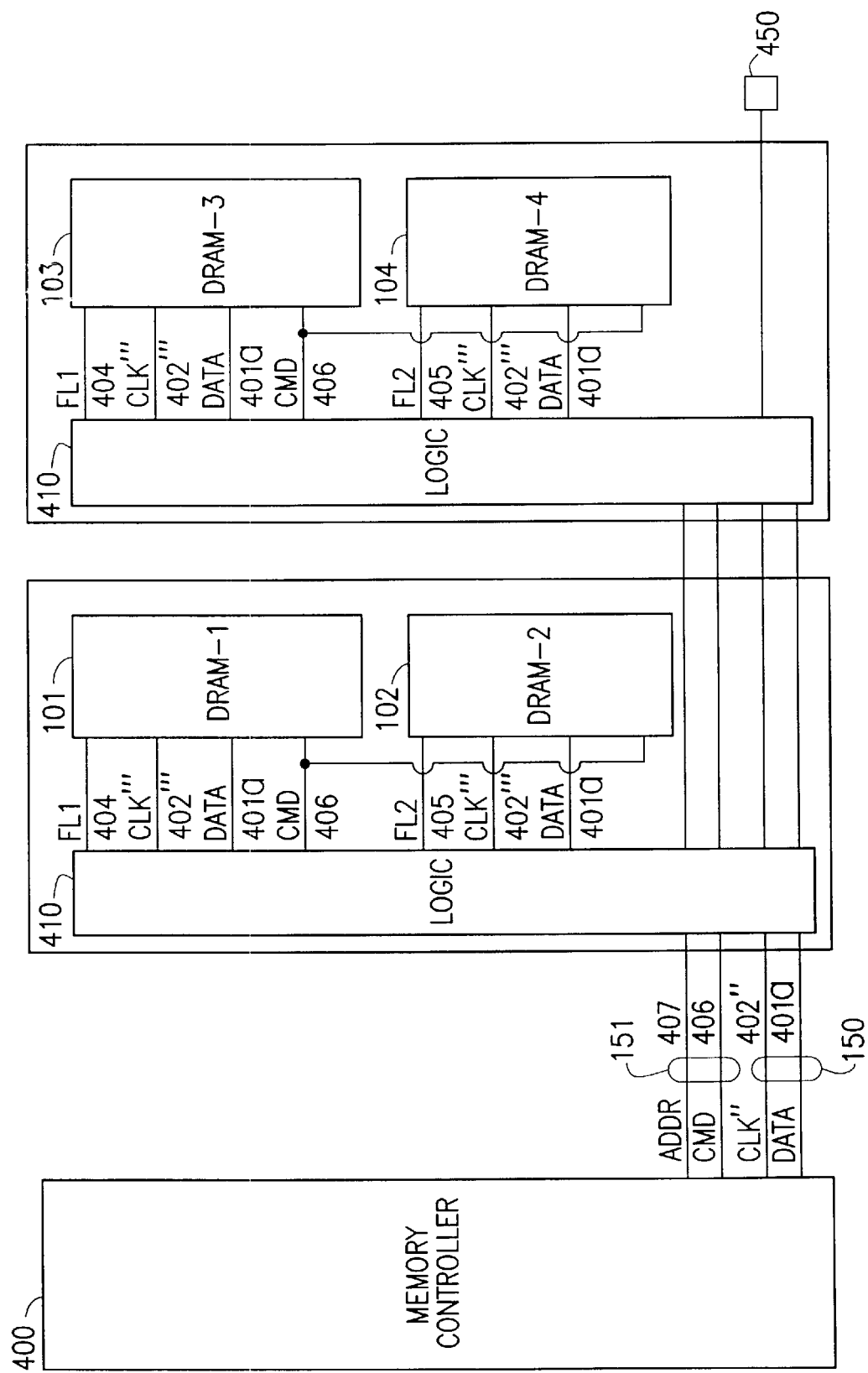
FIG. 7 is a block diagram illustrating a high speed memory system according to the fifth embodiment of the present invention.

Now referring to FIG. 7, there is shown a memory subsystem 100''' according to an embodiment of the present invention in which the flag signals FL1, FL2 are generated by an internal logic 410 on the memory module instead of the memory controller 400. The flag signal lines 404, 405 on each memory module (e.g., memory module 301) are independent from the corresponding flag signals on other memory modules (e.g., memory module 302) and therefore not coupled to the flag signal lines 404, 405 of other memory modules. The memory subsystem 100''' shown in FIG. 7 is typically at a smaller memory system. Since a smaller memory system would have a smaller timing skew, it is possible to use a single clock CLK" on a clock signal line 402". However, this embodiment is not restricted to small memory systems. In a larger memory system the single clock signal CLK" on the clock signal line 402" can be replaced by independent read and write clocks.

The function of the internal logic 410 of each memory module is to generate internal flag signals FL1, FL2 which can be used to equalize the device read latency of the memory devices (e.g., DRAM-1 101 and DRAM-2 102) within a memory module (e.g., memory module 301). The calibration process is modified so that moves between the memory devices in the same memory module. For example, in memory module 301, the calibration process may begin with the "top" memory device (e.g., DRAM-1 101) and continue until the "bottom" memory device (e.g., DRAM-2 102) has been calibrated. This procedure therefore ensures that each memory device (e.g. DRAM-1 101 and DRAM-2 102 ) of a memory module (e.g. memory module 301) is operated with the same device read latency. Thus, after calibration, a memory controller 400 would be able to read any memory device from the same memory module at the same system read latency.

If the memory system 100''' is to be applied to larger memory systems with increased inter-module timing skews, in addition to replacing the single clock CLK" on signal line 402" with independent read and write clocks, the inter-module calibration technique of the other embodiments may also be adopted. The calibration procedure of the other embodiments are applicable to a large memory system implementation of the present embodiment. However, since there are no flag signal lines which run from the memory controller 400 through each memory module 301, 302, the memory controller merely determines whether the calibration pattern has been properly received, and if not, instructs the internal logic 410 of the memory module being calibrated to increase its flag signal timing offset (for each of the within module flags FL1, FL2). The memory controller 400 can instruct the internal logic 410 of a memory module (e.g., memory module 302) to increase its flag timing by a variety of mechanisms, including, for example, sending special commands on the plurality of command lines 406, or via dedicated signal lines (not shown).

Figure 8:
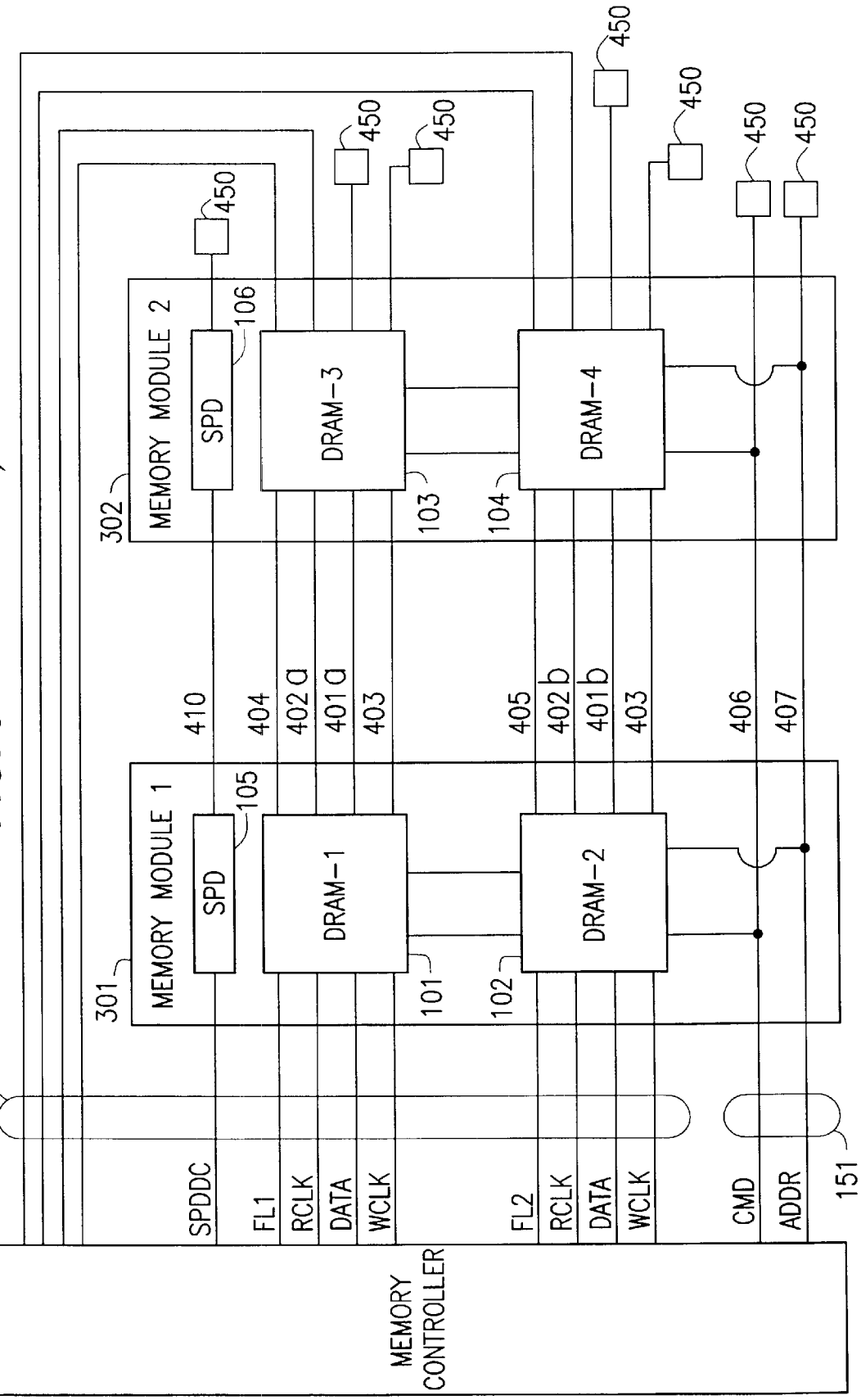
FIG. 8 is a block diagram illustrating a high speed memory system according to the sixth embodiment of the present invention.

Now referring to FIG. 8, there is shown a memory subsystem 100"" according to another embodiment of the present invention. The memory system 100"" is similar to memory system 100 of FIG. 2. However, the memory modules 301, 302 of memory system 100"" each include a configuration memory 105, 106 and at least one associated signal line 410. The configuration memories 105, 106 may be any memory which stores predetermined configuration information regarding the memory devices DRAM-1 101–DRAM-4 104 on a memory module 301, 302. For example, the configuration memories 105, 106 may be a serial presence detect or SPD EEPROMS.

The predetermined configuration data SPDDC may be read by the memory controller 400 using the at least one signal line 410. The configuration data SPDDC includes predetermined flag timing delays for each flag signal line. The predetermined flag timing delays may be specified as a series of single values for each flag signal line (i.e., the actual delay a memory controller should use), or it may be a combination of values which, when taken together, permits the memory controller to calculate the required delay value for each flag signal line. For example, the configuration memory may store a single value representing the system latency common to all memory devices on the memory module as well as a minimum device read latency for each memory device. The memory controller sums the system latency with the appropriate minimum device read latency to calculate the suggested flag timing delay for the flag associated with that memory device. Thus, the memory controller 400 does not need to perform a calibration routine during system initialization. Instead, the required flag timing delays may be read or calculated from the data stored in the configuration memories 105, 106. If the configuration memories 105, 106 specify different flag timing delays for the same flag signal, the memory controller 400 adopts the largest of those flag timing delays for that flag. This permits the memory controller to operate the memory modules 301, 302 at a timing which accommodates the timing requirements of each memory module.

The principles of this embodiment are also applicable to the other previously described embodiments. For example memory systems 100', 100", and 100''', as shown in FIGS. 5–7, may also be similarly modified to include configuration memories and their associated signal line(s) in order to avoid the need for calibration.

Thus, the present invention utilizes one or more flag signals which cause the memory devices to output data associated with a previously accepted read command at a predetermined number of read clock cycles following the arrival of the flag signal. During system initialization, a calibration routine is performed to derive a timing delay between the assertion of a read command and the assertion of the flag signal(s). Alternatively, the timing delay may be predetermined and stored on a configuration memory on the memory module. The timing delay is subsequently used to assert the flag signal(s) during normal operation. The flag signal is used to equalize the system read latency of memory devices. When the flag signals are generated external to the memory module (e.g., by a memory controller), they may be used to equalize the system read latency of memory devices coupled to the flag signal line. Alternatively, the flag signals may Also be generated within each memory module by an on-module logic. If the on-module flag signals never leave the memory module they cannot be used to equalize the system read latency of memory devices of other memory modules. However, they may be used to equalize the system read latencies of the memory devices of the memory module.

While certain embodiments of the invention have been described and illustrated above, the invention is not limited to these specific embodiments as numerous modifications, changes and substitutions of equivalent elements can be made without departing from the spirit and scope of the invention. Accordingly, the scope of the present invention is not to be considered as limited by the specifics of the particular structures which have been described and illustrated, but is only limited by the scope of the appended claims.

What is claimed as new and desired to be protected by Letters Patent of the United States is:

1. A memory device comprising:

a memory array;

at least one data signal line coupled to said memory array;

a control circuit;

a read clock signal line coupled to said control circuit for receiving a read clock signal;

a flag signal line coupled to said control circuit for receiving a flag signal;

at least one command signal line coupled to said control circuit for receiving commands; and wherein said control circuit causes the memory device to output data from said array associated with a previously accepted command on said at least one data signal line, beginning at a predetermined number of read clock cycles after the control circuit receives the flag signal.

2. The memory device of claim 1, wherein the previously accepted command is a read command.

3. The memory device of claim 1, wherein the previously accepted command is a calibrate command.

4. The memory device of claim 3, wherein the output data is a calibration pattern.

5. The memory device of claim 4, wherein the calibration pattern includes at least two successive bits which have a different logic state.

6. The memory device of claim 5, wherein said calibration pattern has its first bit set to a binary 0 and all subsequent bits set to a binary 1.

7. The memory device of claim 5, wherein said calibration pattern has its first bit set to a binary 1 and all subsequent bits set to a binary 0.

8. The memory device of claim 1, wherein said memory device is arranged with at least one other memory device the memory device and each of the at least one other memory device having their flag signal lines coupled and their command signal lines coupled, and wherein each memory device receives the flag signal over their respective flag signal lines at the same number of read clock cycles after each memory device of the rank receives a read command.

9. The memory device of claim 1, wherein said memory device is arranged with at least one other memory device on a memory module, the memory module and each of the at least one other memory device having their flag signal lines coupled to a flag generation logic located on the memory module.

10. A memory module comprising:

a plurality of memory devices, wherein each of said memory devices further comprises, a memory array;

at least one data signal line coupled to said memory array;

a control circuit;

a read clock signal line coupled to said control circuit for receiving a read clock signal;

a flag signal line coupled to said control circuit for receiving a flag signal;

at least one command signal line coupled to said control circuit for receiving a read command; and wherein said control circuit causes the memory device to output data from said array associated with a previously accepted command on said at least one data signal line, beginning at a predetermined number of read clock cycles after the control circuit receives the flag signal.

11. The memory module of claim 10, wherein the previously accepted command is a read command.

12. The memory module of claim 10, wherein the previously accepted command is a calibrate command.

13. The memory module of claim 12, wherein the data is output is a calibration pattern.

14. The memory module of claim 13, wherein the calibration pattern includes at least two successive bits which have a different logic state.

15. The memory module of claim 14, wherein said calibration pattern has its first bit set to a binary 0 and all subsequent bits set to a binary 1.

16. The memory module of claim 14, wherein said calibration pattern has its first bit set to a binary 1 and all subsequent bits set to a binary 0.

17. The memory module of claim 10, further comprising:
a flag generation logic coupled to each of said plurality of memory devices by their respective flag signal lines.

18. The memory module of claim 17, wherein said flag generation logic sends the flag signal to each of the plurality of memory devices at the same number of read clock cycles after a read command is sent to each of the plurality of memory devices.

19. The memory module of claim 18, wherein each of the plurality of memory devices outputs read data at the same predetermined number of read clock cycles after receiving the flag signal.

20. The memory module of claim 10, wherein said memory module is coupled with at least one other memory module so that each of the plurality of memory devices on the memory module has its flag signal line coupled with the flag signal lines of each corresponding memory device from the at least one other memory module.

21. A computer system comprising:
a processor;
a memory controller coupled to the processor;
a first memory module having a first plurality of memory devices wherein said first plurality of memory devices includes a first read clock signal line for receiving a read clock signal, said first read clock signal line being coupled to a second read clock signal line of a second plurality of memory devices in a second memory module;
a command signal line for receiving commands; and
a flag signal line for receiving a flag signal from said memory controller, said flag signal line being coupled to said first and second pluralities of memory devices, wherein the flag signal causes the first and second pluralities of memory devices to output data corresponding to a previously accepted command received on the command signal line beginning at a predetermined number of read clock cycles after receipt of the flag signal by said memory controller.

22. The computer system of claim 21, wherein the previously accepted command is a read command.

23. The computer system of claim 21, wherein the previously accepted command is a calibrate command.

24. The computer system of claim 23, wherein the data is output is a calibration pattern.

25. The computer system of claim 24, wherein the calibration pattern includes at least two successive bits which have a different logic state.

26. The computer system of claim 25, wherein said calibration pattern has its first bit set to a binary 0 and all subsequent bits set to a binary 1.

27. The computer system of claim 21, wherein said calibration pattern has its first bit set to a binary 1 and all subsequent bits set to a binary 0.

28. The computer system of claim 21, further comprising:
a clock buffer coupled to said memory controller by a master read clock signal line and to said first and second pluralities of memory devices by the first and second read clock signal lines,
wherein said clock buffer retransmits a master read clock signal received on the master read clock signal line with minimal delay.

29. A computer system comprising:
a processor;
a memory controller coupled to the processor;
at least one memory module coupled to the memory controller, each of said at least one memory module having at least one set of memory devices, each of said at least one set of memory devices further comprising:
a flag generation logic, and
a plurality of memory devices, wherein each of said memory devices comprises,
a read clock signal line for receiving a read clock signal, said read clock signal line being coupled to read clock signal lines of other corresponding memory devices on others of the at least one memory module;
at least one command signal line for receiving commands;
at least one data signal line coupled to said memory array; and
a flag signal line coupled to said flag generation logic for receiving a flag signal,
wherein the flag signal causes the memory device to output data on said data signal line corresponding to a previously accepted command received on the command signal line, beginning at a predetermined number of read clock cycles after receipt of the flag signal by the flag generation logic.

30. The computer system of claim 29, wherein the flag generation logic transmits the flag signal to each coupled memory devices using the same number of read clock cycles subsequent to the coupled memory devices receiving a read command.

31. A method of operating a memory device coupled to a memory controller, a read clock signal source, and a flag signal source, comprising:
receiving a command from the memory controller;
receiving a flag signal from the flag signal source;
receiving a read clock signal from the read clock signal source;
outputting a data associated with the command synchronized with the read clock signal and beginning at a predetermined number of read clock cycles after receiving the flag signal.

32. The method of claim 31, wherein the command is a read command.

33. The method of claim 31, wherein the command is a calibrate command.

34. The method of claim 33, wherein the data is a calibration pattern.

35. The method of claim 34, wherein the calibration pattern includes at least two successive bits which have a different logic state.

36. The method of claim 35, wherein said calibration pattern has its first bit set to a binary 0 and all subsequent bits set to a binary 1.

37. The method of claim 35, wherein said calibration pattern has its first bit set to a binary 1 and all subsequent bits set to a binary 0.

38. The method of claim 31, wherein said read clock source is the memory controller and said flag signal source is the memory controller.

39. The method of claim 31, wherein said memory device is located on a memory module and said flag signal source is a flag generation logic located on said memory module.

40. A memory device comprising:

a memory array;

a control circuit;

a read clock signal line coupled to said control circuit at a first terminal for receiving a read clock signal, said read clock signal line coupled to said control circuit at a second terminal for returning said read clock signal to said control circuit;

a flag signal line coupled to said control circuit at a third terminal for receiving a flag signal, said flag signal line coupled to said to said control circuit at a fourth terminal for returning said flag signal to said control circuit, said flag signal line and said read clock signal line being routed so as to have equivalent signal propagation times.

41. A memory device as defined in claim 40 wherein said control circuit is adapted to receive a calibration signal from said memory array at a finite latency time after receipt of said flag signal at said fourth terminal.

* * * * *